(12) United States Patent
Udrea et al.

(10) Patent No.: US 10,164,078 B2
(45) Date of Patent: Dec. 25, 2018

(54) BIPOLAR SEMICONDUCTOR DEVICE WITH MULTI-TRENCH ENHANCEMENT REGIONS

(71) Applicant: Infineon Technologies Americas Corp., El Segundo, CA (US)

(72) Inventors: Florin Udrea, Cambridge (GB); Gianluca Camuso, Cambridge (GB); Alice Pei-Shan Hsieh, Cambridge (GB); Chiu Ng, El Segundo, CA (US); Yi Tang, Torrance, CA (US); Rajeev Krishna Vytla, Los Angeles, CA (US); Canhua Li, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/074,062

(22) Filed: Mar. 18, 2016

(65) Prior Publication Data

US 2017/0271488 A1    Sep. 21, 2017

(51) Int. Cl.
| H01L 29/739 | (2006.01) |
| H01L 29/08 | (2006.01) |
| H01L 29/06 | (2006.01) |
| H01L 29/10 | (2006.01) |
| H01L 29/423 | (2006.01) |

(52) U.S. Cl.
CPC ...... *H01L 29/7397* (2013.01); *H01L 29/0696* (2013.01); *H01L 29/0804* (2013.01); *H01L 29/0821* (2013.01); *H01L 29/1095* (2013.01); *H01L 29/4236* (2013.01)

(58) Field of Classification Search
CPC ............. H01L 29/7397; H01L 29/0696; H01L 29/0804; H01L 29/0821; H01L 29/1095; H01L 29/4236; H01L 29/7813; H01L 29/29; H01L 29/407; H01L 29/66734; H01L 29/0619; H01L 29/66348;
(Continued)

(56) References Cited

U.S. PATENT DOCUMENTS

| 5,326,711 A | 7/1994 | Malbi |
| 6,040,599 A * | 3/2000 | Takahashi ........... H01L 29/0696 257/330 |

(Continued)

*Primary Examiner* — Marvin Payen
*Assistant Examiner* — Jeremy Joy
(74) *Attorney, Agent, or Firm* — Murphy, Bilak & Homiller, PLLC

(57) ABSTRACT

There are disclosed herein various implementations of a bipolar semiconductor device with multi-trench enhancement regions. Such a bipolar semiconductor device includes a drift region having a first conductivity type situated over an anode layer having an opposite, second conductivity type. The device also includes a first control trench extending through an inversion region having the second conductivity type, and further extending into the drift region, the first control trench being adjacent to cathode diffusions. In addition, the device includes first and second depletion trenches, each having a depletion electrode, the first depletion trench being situated between the second depletion trench and the first control trench. An enhancement region having the first conductivity type is localized in the drift region and extends from the first control trench to the first second depletion trench and further from the first depletion trench to the second depletion trench.

18 Claims, 3 Drawing Sheets

(58) Field of Classification Search
CPC ............. H01L 29/7811; H01L 29/7806; H01L 29/0834; H01L 29/7803
See application file for complete search history.

(56) References Cited

U.S. PATENT DOCUMENTS

| | | | |
|---|---|---|---|
| 6,781,199 B2 | 8/2004 | Takahashi | |
| 6,815,769 B2 | 11/2004 | Pfirsch | |
| 7,095,079 B2 | 8/2006 | Okuno | |
| 7,615,846 B2 | 11/2009 | Harada | |
| 8,441,046 B2 | 5/2013 | Bobde | |
| 8,742,500 B2* | 6/2014 | Onishi | H01L 29/0619 257/127 |
| 2002/0179976 A1* | 12/2002 | Takahashi | H01L 29/407 257/370 |
| 2003/0042537 A1 | 3/2003 | Nakamura et al. | |
| 2005/0263853 A1* | 12/2005 | Tomomatsu | H01L 29/0834 257/565 |
| 2007/0108468 A1* | 5/2007 | Takahashi | H01L 29/0696 257/133 |
| 2008/0012050 A1* | 1/2008 | Aoki | H01L 29/0696 257/262 |
| 2009/0020852 A1* | 1/2009 | Harada | H01L 29/0696 257/579 |
| 2009/0278166 A1* | 11/2009 | Soeno | H01L 27/0664 257/133 |
| 2009/0283797 A1* | 11/2009 | Takahashi | H01L 29/7397 257/139 |
| 2011/0233684 A1 | 9/2011 | Matsushita | |
| 2012/0043581 A1* | 2/2012 | Koyama | H01L 29/0696 257/140 |
| 2012/0146091 A1* | 6/2012 | Tanabe | H01L 29/0696 257/139 |
| 2013/0009205 A1* | 1/2013 | Tsuzuki | H01L 29/7397 257/140 |
| 2013/0256744 A1* | 10/2013 | Tang | H01L 29/7397 257/139 |
| 2015/0144988 A1 | 5/2015 | Laven et al. | |
| 2015/0221756 A1 | 8/2015 | Vellei et al. | |

* cited by examiner

BIPOLAR SEMICONDUCTOR DEVICE WITH MULTI-TRENCH ENHANCEMENT REGIONS

BACKGROUND

Bipolar semiconductor devices suitable for use as power switches, such as insulated-gate bipolar transistors (IGBTs), for example, may be implemented in a variety of applications. For instance, IGBTs may be used as power switches in motor drive inverters, as well as in direct-current (DC) to DC power converters. In these and other power applications, on-state voltage drop ($V_{ON}$), turn-off losses ($E_{OFF}$), and turn-off delay time ($T_{d,OFF}$) are important operating parameters.

However, conventional techniques for producing desirable on-state characteristics, such as low $V_{ON}$, can undesirably result in increased $E_{OFF}$ and longer $T_{d,OFF}$. As switching speed increases, switching losses, including $E_{OFF}$, typically represent a significant portion of total power loss by a bipolar power switch. Consequently, IGBTs and other bipolar switching devices having desirable on-state characteristics and reduced $E_{OFF}$ and $T_{d,OFF}$ during fast switching are highly sought after in the art.

SUMMARY

The present disclosure is directed to a bipolar semiconductor device with multi-trench enhancement regions, substantially as shown in and/or described in connection with at least one of the figures, and as set forth in the claims.

DETAILED DESCRIPTION

Figure 1:
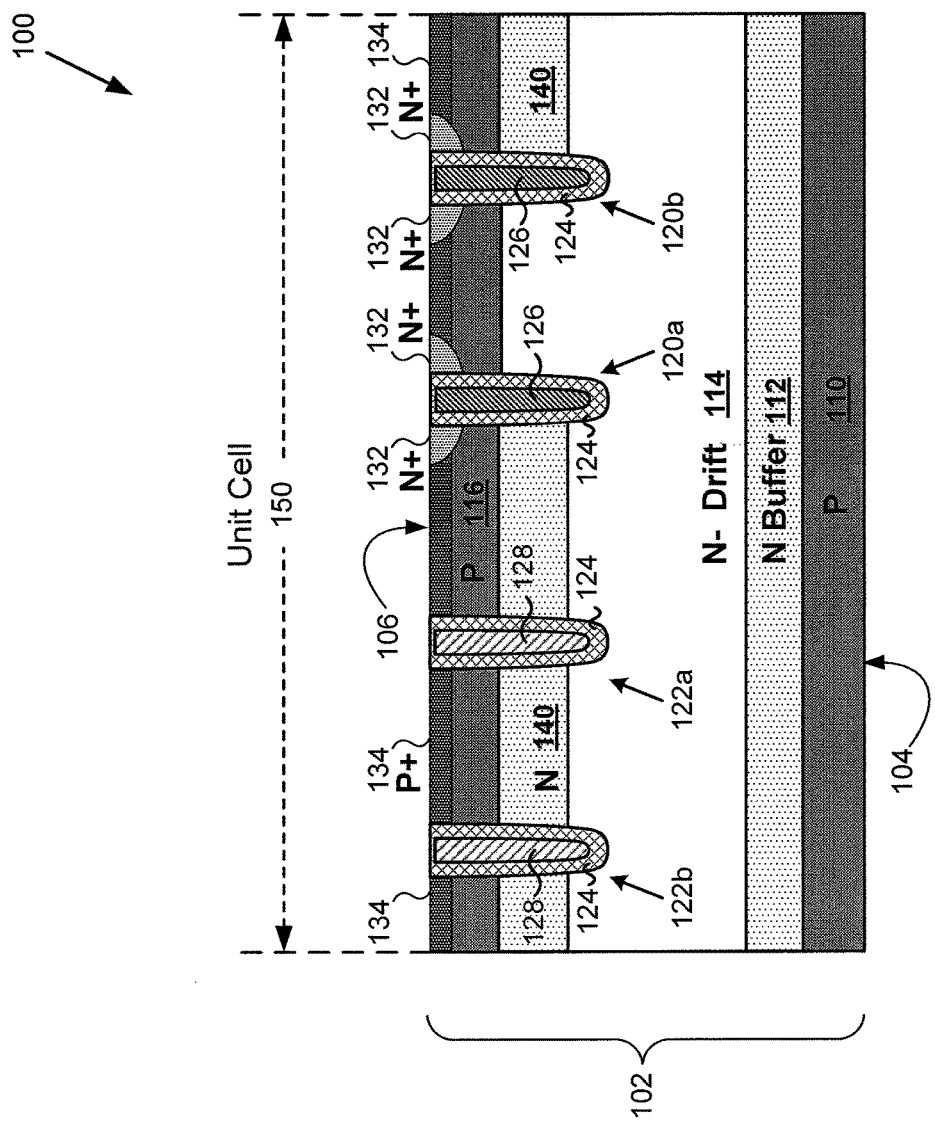
FIG. 1 presents a cross-sectional view showing a portion of an exemplary bipolar semiconductor device with multi-trench enhancement regions, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a cross-sectional view showing unit cell 150 of exemplary bipolar semiconductor device 100 with multi-trench enhancement regions, according to one implementation. As shown in FIG. 1, bipolar semiconductor device 100 is implemented as a vertical power device including P type anode layer 110 at bottom surface 104 of semiconductor substrate 102, and N type drift region 114 situated over P type anode layer 110. In addition, P type inversion region 116 is situated over N type drift region 114. As further shown in FIG. 1, bipolar semiconductor device 100 includes N type buffer or field stop layer 112 (hereinafter "buffer layer 112"), as well as N type cathode diffusions 132 and P type contacts 134 formed in P type inversion region 116. It is noted that although single unit cell 150 is shown in FIG. 1 for conceptual clarity, bipolar semiconductor device 100 includes a plurality of unit cells, each of which may include the features attributed to unit cell 150 and described in the present application.

According to the exemplary implementation shown in FIG. 1, unit cell 150 of bipolar semiconductor device 100 includes first control trench 120a and second control trench 120b, each extending from top surface 106 of semiconductor substrate 102, through P type inversion region 116, and further extending into N type drift region 114. As shown in FIG. 1, each of first control trench 120a and second control trench 120b is adjacent to N type cathode diffusions 132, and includes trench insulator 124 and control trench electrode 126.

In addition, unit cell 150 of bipolar semiconductor device 100 includes first and second depletion trenches 122a and 122b adjacent to first control trench 120a. As further shown in FIG. 1, each of first depletion trench 122a and second depletion trench 122b includes trench insulator 124 and depletion electrode 128, but neither first depletion trench 122a nor second depletion trench 122b is bordered by cathode diffusions 132. It is noted that first depletion trench 122a is situated between second depletion trench 122b and first control trench 120a. It is further noted that first control trench 120a is situated between second control trench 120b and first and second depletion trenches 122a and 122b.

Unit cell 150 of bipolar semiconductor device 100 also includes N type enhancement region 140. N type enhancement region 140 is localized in N type drift region 114 and extends from first control trench 120a to first depletion trench 122a and further from first depletion trench 122a to second depletion trench 122b. N type enhancement region 140 may therefore be characterized as a multi-trench enhancement region. Moreover, and as shown in FIG. 1, in some implementations, N type enhancement region 140 adjoins each of first control trench 120a and first and second depletion trenches 122a and 122b.

It is emphasized, however, that N type enhancement region 140 is localized in N type drift region 114 so as not to extend between first control trench 120a and second control trench 120b. As a result, and as shown in FIG. 1, N type enhancement region 140 is not present, i.e., is absent, between first and second control trenches 120a and 120b.

In operation, bipolar semiconductor device 100 is configured to produce conduction channels through P type inversion region 116 in regions beneath N type cathode diffusions 132 and immediately adjacent first and second control trenches 120a and 120b. Thus, when bipolar semiconductor device 100 is turned on, conduction channels (not shown as such in FIG. 1) are produced as N type conduction channels through P type inversion region 116 so as to enable transfer of charge carriers between N type cathode diffusions 132 and P type anode layer 110.

Although the implementation shown in FIG. 1 depicts bipolar semiconductor device 100 as having P type anode layer 110, N type buffer layer 112, N type drift region 114, N type enhancement region 140, P type inversion region 116, N type cathode diffusions 132, and as being configured to produce N type conduction channels, that representation is merely exemplary. In other implementations, the described polarities can be reversed. That is to say, bipolar semiconductor device 100 may have an N type layer corresponding to P type anode layer 110, a P type buffer layer, a P type drift region, a P type enhancement region, an N type inversion region, P type diffusions corresponding to N type cathode diffusions 132, and may be configured to produce P type conduction channels adjacent first and second control trenches 120a and 120b.

According to one exemplary implementation, bipolar semiconductor device 100 may take the form of an insulated-gate bipolar transistor (IGBT). In that implementation, P type anode layer 110 corresponds to a P type collector layer, P type inversion region 116 corresponds to a P type base, and N type cathode diffusions 132 correspond to N type emitter diffusions of the IGBT. Moreover, when bipolar semiconductor device 100 is implemented as an IGBT, first and second control trenches 120a and 120b correspond to gate trenches of the IGBT, each including a gate insulator and a gate electrode corresponding respectively to trench insulator 124 and control trench electrode 126.

Semiconductor substrate 102 may be a silicon (Si) substrate or a silicon carbide (SiC) substrate, for example. In some implementations, semiconductor substrate 102 may include N type drift region 114 and P type inversion region 116 formed in an epitaxial silicon layer of semiconductor substrate 102. Formation of such an epitaxial silicon layer may be performed by any suitable method, as known in the art, such as chemical vapor deposition (CVD) or molecular beam epitaxy (MBE), for example. More generally, however, N type drift region 114 and P type inversion region 116 may be formed in any suitable elemental or compound semiconductor layer included in semiconductor substrate 102.

Thus, in other implementations, N type drift region 114 and P type inversion region 116 need not be formed through epitaxial growth, and/or need not be formed of silicon. For example, in one alternative implementation, N type drift region 114 and P type inversion region 116 can be formed in a float zone silicon layer of semiconductor substrate 102. In other implementations, N type drift region 114 and P type inversion region 116 can be formed in either a strained or untrained germanium layer formed as part of semiconductor substrate 102. Moreover, in some implementations, semiconductor substrate 102 may include additional layers, such as N type buffer layer 112 situated between P type anode layer 110 and N type drift region 114, as shown in FIG. 1.

P type inversion region 116 may be formed by implantation and thermal diffusion. For example, boron (B) dopants may be implanted into semiconductor substrate 102 and diffused to form P type inversion region 116. Moreover, P type contacts 134 of P type inversion region 116 may be more highly doped regions of P type inversion region 116 utilizing the same dopant species used to form P type inversion region 116.

Trench insulator 124 may be formed using any material and any technique typically employed in the art. For example, trench insulator 124 may be formed of silicon oxide, and may be deposited or thermally grown to line first and second control trenches 120a and 120b, and first and second depletion trenches 122a and 122b. Control trench electrodes 126 may also be formed using any material typically utilized in the art. For example, control trench electrodes 126 may be formed of doped polysilicon or metal.

Like control trench electrodes 126, depletion electrodes 128 may be formed using any material typically utilized in the art, such as doped polysilicon or metal. Moreover, although identified by different reference numbers in FIG. 1, depletion electrodes 128 may be formed of the same material as control trench electrodes 126, and may be fabricated in the same processing step utilized to produce control trench electrodes 126. However, unlike control trench electrodes 126, depletion electrodes 128 may be electrically floating, or may be electrically tied to N type cathode diffusions 132. It is noted that although not explicitly shown in FIG. 1, depletion electrodes 128 can be electrically connected to one another and/or to N type cathode diffusions 132 in the third dimension relative to the cross-sectional perspective shown by FIG. 1.

N type cathode diffusions 132 may be selectively formed in P type inversion region 116 using any conventional techniques known in the art. For example, phosphorus (P) or arsenic (As) dopants may be implanted into P type inversion region 116 and diffused to form N type cathode diffusions 132. As may be the case for depletion electrodes 128, and although also not explicitly shown in FIG. 1, N type cathode diffusions 132 can be electrically connected to one another in the third dimension relative to the cross-sectional perspective shown by FIG. 1.

N type enhancement region 140 may have a doping concentration greater than that of N type drift region 114 and less than that of N type cathode diffusions 132. In one implementation, N type enhancement region 140 may have a doping concentration substantially equal to that of N type buffer layer 112. For example, N type enhancement region 140 may have a doping concentration of from approximately $1\times10^{15}/cm^3$ to approximately $1\times10^{16}/cm^3$, while the doping concentration of N type drift region 114 is typically from approximately $1\times10^{13}/cm^3$ to approximately $2\times10^{14}/cm^3$. Moreover, according to the exemplary implementation shown in FIG. 1, N type enhancement region 140 adjoins P type inversion region 116 and terminates in N type drift region 114, above N type buffer layer 112. In other words, N type enhancement region 140 adjoins P type inversion region 116 while being spaced apart from N type buffer layer 112 by N type drift region 114.

The reduced charge in the upper portion of N type drift region 114 due to the absence of N type enhancement region 140 between first control trench 120a and second control trench 120b allows the depletion region that begins to form when bipolar semiconductor device 100 is turned off to expand more rapidly. In addition, the Miller capacitance of bipolar semiconductor device 100 is reduced due to the overall reduction in charge between top surface 106 and P type anode layer 110. Consequently, turn-off losses ($E_{OFF}$) and turn-off delay time ($T_{d,OFF}$) are substantially improved, i.e., reduced, in the implementation shown in FIG. 1, when compared to conventional bipolar semiconductor devices, such as conventional IGBTs. Moreover, these advantages may be achieved while maintaining the on-state voltage drop ($V_{ON}$) of bipolar semiconductor device 100 at a desirable level.

Additional advantages accrue from the implementation shown in FIG. 1 when the unit cell pitch of bipolar semiconductor device 100 becomes ultra-narrow. During the on-state, such an ultra-narrow geometry would typically result in a high electric field (E) between first depletion trench 122a and first control trench 120a if N type enhancement region 140 did not extend between first control trench 120a and first depletion trench 122a. That high electric field could cause the accumulation of holes along the sidewalls of first depletion trench 122a, which would enhance the extraction of holes during conduction, resulting in poorer conductivity modulation. The presence of N type enhancement region 140 between first control trench 120a and first depletion trench 122a advantageously reduces such an electric field, thereby improving conductivity modulation for a bipolar semiconductor device, such as an IGBT, having an ultra-narrow unit cell pitch.

Figure 2:
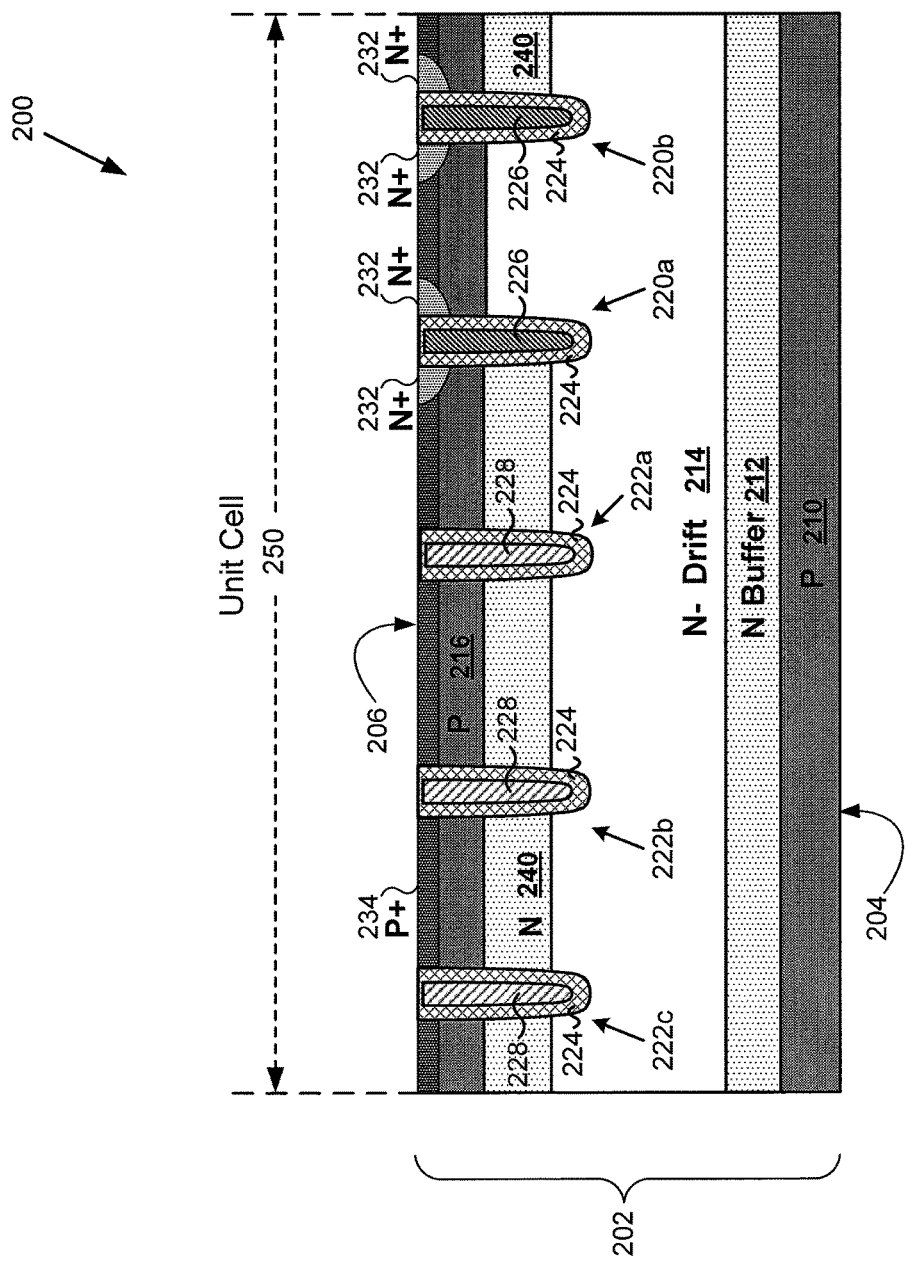
FIG. 2 presents a cross-sectional view showing a portion of an exemplary bipolar semiconductor device with multi-trench enhancement regions, according to another implementation.

Continuing to FIG. 2, FIG. 2 presents a cross-sectional view showing unit cell 250 of exemplary bipolar semiconductor device 200 with multi-trench enhancement regions, according to another implementation. As shown in FIG. 2, bipolar semiconductor device 200 is implemented as a vertical power device including P type anode layer 210 at bottom surface 204 of semiconductor substrate 202, and N type drift region 214 situated over P type anode layer 210. In addition, P type inversion region 216 is situated over N type drift region 214. As further shown in FIG. 2, bipolar semiconductor device 200 includes N type buffer layer 212, as well as N type cathode diffusions 232 and P type contacts 234 formed in P type inversion region 216. It is noted that although single unit cell 250 is shown in FIG. 2 for conceptual clarity, bipolar semiconductor device 200 includes a plurality of unit cells, each of which may include the features attributed to unit cell 250 and described in the present application.

According to the exemplary implementation shown in FIG. 2, unit cell 250 of bipolar semiconductor device 200 includes first control trench 220a and second control trench 220b, each extending from top surface 206 of semiconductor substrate 202, through P type inversion region 216, and further extending into N type drift region 214. As shown in FIG. 2, each of first control trench 220a and second control trench 220b is adjacent to N type cathode diffusions 232, and includes trench insulator 224 and control trench electrode 226.

In addition, unit cell 250 of bipolar semiconductor device 200 includes first, second, and third depletion trenches 222a, 222b, and 222c adjacent to first control trench 220a. As further shown in FIG. 2, each of first depletion trench 222a, second depletion trench 222b, and third depletion trench 222c includes trench insulator 224 and depletion electrode 228, but none of first depletion trench 222a, second depletion trench 222b, or third depletion trench 222c is bordered by cathode diffusions 232. It is noted that first depletion trench 222a is situated between first control trench 220a and second and third depletion trenches 222b and 222c. It is further noted that first control trench 220a is situated between second control trench 220b and first, second, and third depletion trenches 222a, 222b, and 222c.

Unit cell 250 of bipolar semiconductor device 200 also includes N type enhancement region 240. N type enhancement region 240 is localized in N type drift region 214 and extends from first control trench 220a to first depletion trench 222a, from first depletion trench 222a to second depletion trench 222b, and further extends from second depletion trench 222b to third depletion trench 222c. N type enhancement region 240 may therefore be characterized as a multi-trench enhancement region. Moreover, and as shown in FIG. 2, in some implementations, N type enhancement region 240 adjoins each of first control trench 220a and first, second, and third depletion trenches 222a, 222b, and 222c.

It is emphasized, however, that N type enhancement region 240 is localized in N type drift region 214 so as not to extend between first control trench 220a and second control trench 220b. As a result, and as shown in FIG. 2, N type enhancement region 240 is not present, i.e., is absent, between first and second control trenches 220a and 220b.

Bipolar semiconductor device 200 corresponds in general to bipolar semiconductor device 100, in FIG. 1. That is to say, semiconductor substrate 202, P type anode layer 210, N type buffer layer 212, and N type drift region 214, in FIG. 2, correspond respectively in general to semiconductor substrate 102, P type anode layer 110, N type buffer layer 112, and N type drift region 114, in FIG. 1, and may share any of the characteristics attributed to those corresponding features, above.

In addition, P type inversion region 216, P type contacts 234, and N type cathode diffusions 232, in FIG. 2, correspond respectively in general to P type inversion region 116, P type contacts 134, and N type cathode diffusions 132, in FIG. 1 and may share any of the characteristics attributed to those corresponding features, above. First control trench 220a and second control trench 220b, each including trench insulator 224 and control trench electrode 226, in FIG. 2, correspond respectively in general to first control trench 120a and second control trench 120b, each including trench insulator 124 and control trench electrode 126, in FIG. 1, and may share any of the characteristics attributed to those corresponding features, above.

Moreover, first and second depletion trenches 222a and 222b, each including trench insulator 224 and depletion electrode 228, correspond respectively in general to first and second depletion trenches 122a and 122b, each including trench insulator 124 and depletion electrode 128, in FIG. 1, and may share any of the characteristics attributed to those corresponding features, above. In addition, third depletion trench 222c including trench insulator 224 and depletion electrode 228, corresponds in general to either of first or second depletion trenches 122a and 122b including trench insulator 124 and depletion electrode 128, in FIG. 1, and may share any of the characteristics attributed to those corresponding features, above.

N type enhancement region 240, in FIG. 2, corresponds in general to N type enhancement region 140, in FIG. 1, and may share any of the characteristics attributed to that corresponding feature, above. In other words, N type enhancement region 240 is a multi-trench enhancement region and may have a doping concentration of from approximately $1\times10^{15}/cm^3$ to approximately $1\times10^{16}/cm^3$.

It is noted that, like bipolar semiconductor device 100, in FIG. 1, bipolar semiconductor device 200, in FIG. 2, may take the form of an IGBT. In that implementation, P type anode layer 210 corresponds to a P type collector layer, P type inversion region 216 corresponds to a P type base, and N type cathode diffusions 232 correspond to N type emitter diffusions of the IGBT. Moreover, when bipolar semiconductor device 200 is implemented as an IGBT, first and second control trenches 220a and 220b correspond respectively to first and second gate trenches of the IGBT, each including a gate insulator and a gate electrode corresponding respectively to trench insulator 224 and control trench electrode 226.

The reduced charge in the upper portion of N type drift region 214 due to the absence of N type enhancement region 240 between first control trench 220a and second control trench 220b allows the depletion region that begins to form when bipolar semiconductor device 200 is turned off to expand more rapidly. In addition, the Miller capacitance of bipolar semiconductor device 200 is reduced due to the overall reduction in charge between top surface 206 and P type anode layer 210. Consequently, $E_{OFF}$ and $T_{d,OFF}$ are substantially improved, i.e., reduced, in the implementation shown in FIG. 2, when compared to conventional bipolar semiconductor devices, such as conventional IGBTs. Moreover, these advantages may be achieved while maintaining the $V_{ON}$ of bipolar semiconductor device 200 at a desirable level.

Additional advantages accrue from the implementation shown in FIG. 2 when the unit cell pitch of bipolar semiconductor device 200 becomes ultra-narrow. During the on-state, such an ultra-narrow geometry would typically result in a high electric field between first depletion trench 222a and first control trench 220a if N type enhancement region 240 did not extend between first control trench 220a and first depletion trench 222a. That high electric field could cause the accumulation of holes along the sidewalls of first depletion trench 222a, which would enhance the extraction of holes during conduction, resulting in poorer conductivity modulation. The presence of N type enhancement region 240 between first control trench 220a and first depletion trench 222a advantageously reduces such an electric field, thereby improving conductivity modulation for a bipolar semiconductor device, such as an IGBT, having an ultra-narrow unit cell pitch.

Figure 3:
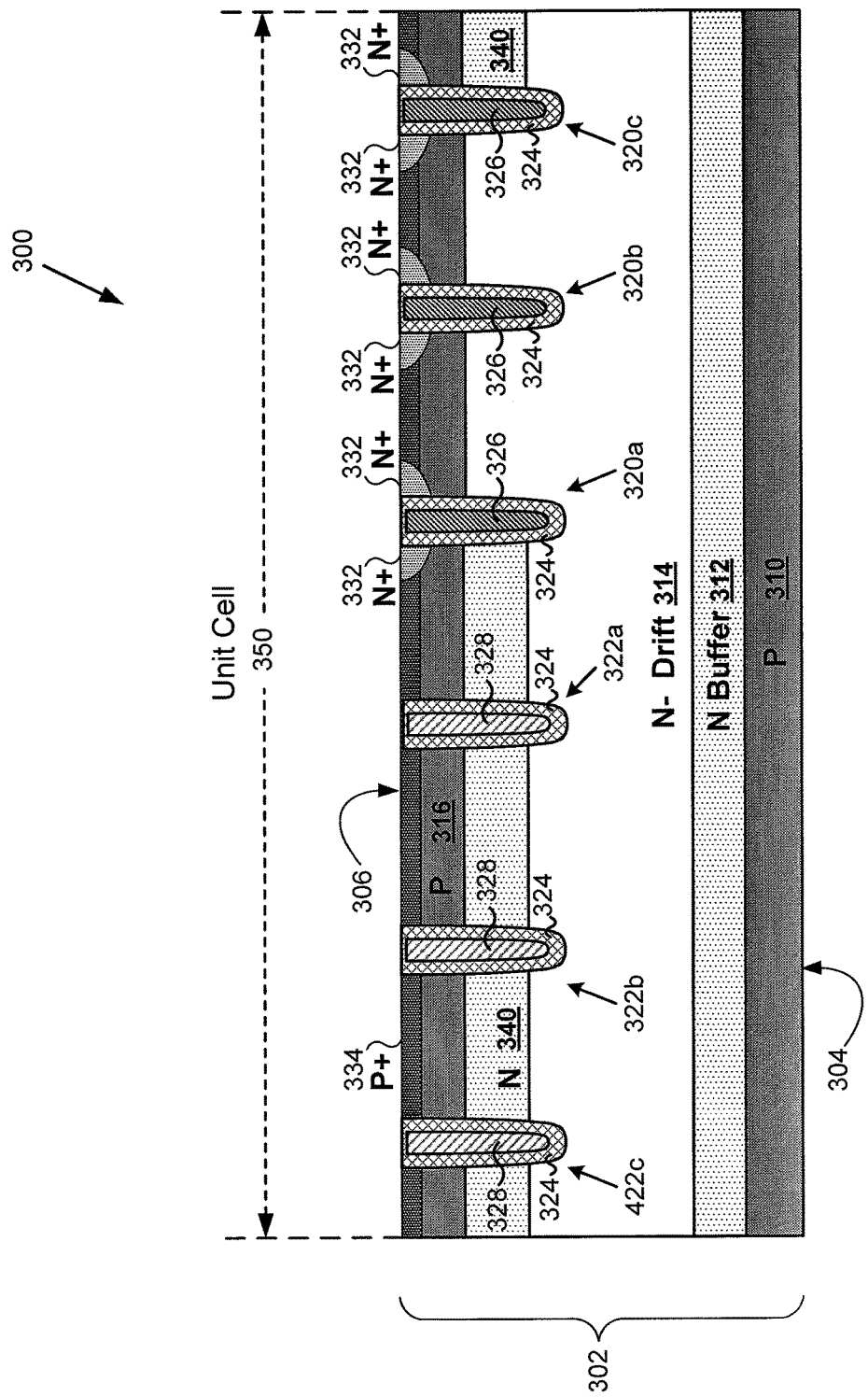
FIG. 3 presents a cross-sectional view showing a portion of an exemplary bipolar semiconductor device with multi-trench enhancement regions, according to a further implementation.

Moving to FIG. 3, FIG. 3 presents a cross-sectional view showing unit cell 350 of exemplary bipolar semiconductor device 300 with multi-trench enhancement regions, according to a further implementation. As shown in FIG. 3, bipolar semiconductor device 300 is implemented as a vertical power device including P type anode layer 310 at bottom surface 304 of semiconductor substrate 302, and N type drift region 314 situated over P type anode layer 310. In addition, P type inversion region 316 is situated over N type drift region 314. As further shown in FIG. 3, bipolar semiconductor device 300 includes N type buffer layer 312, as well as N type cathode diffusions 332 and P type contacts 334 formed in P type inversion region 316. It is noted that although single unit cell 350 is shown in FIG. 3 for conceptual clarity, bipolar semiconductor device 300 includes a plurality of unit cells, each of which may include the features attributed to unit cell 350 and described in the present application.

According to the exemplary implementation shown in FIG. 3, unit cell 350 of bipolar semiconductor device 300 includes first control trench 320a, second control trench 320b, and third control trench 320c, each extending from top surface 306 of semiconductor substrate 302, through P type inversion region 316, and further extending into N type drift region 314. As shown in FIG. 3, each of first control trench 320a, second control trench 320b, and third control trench 320c is adjacent to N type cathode diffusions 332, and includes trench insulator 324 and control trench electrode 326.

In addition, unit cell 350 of bipolar semiconductor device 300 includes first, second, and third depletion trenches 322a, 322b, and 322c adjacent to first control trench 320a. As further shown in FIG. 3, each of first depletion trench 322a, second depletion trench 322b, and third depletion trench 322c includes trench insulator 324 and depletion electrode 328, but none of first depletion trench 322a, second depletion trench 322b, or third depletion trench 322c, is bordered by cathode diffusions 332. It is noted that first depletion trench 322a is situated between first control trench 320a and second and third depletion trenches 322b and 322c. It is further noted that first control trench 320a is situated between first depletion trench 322a and second and third control trenches 320b and 320c.

Unit cell 350 of bipolar semiconductor device 300 also includes N type enhancement region 340. N type enhancement region 340 is localized in N type drift region 314 and extends from first control trench 320a to first depletion trench 322a, from first depletion trench 322a to second depletion trench 322b, and further extends from second depletion trench 322b to third depletion trench 322c. N type enhancement region 340 may therefore be characterized as a multi-trench enhancement region. Moreover, and as shown in FIG. 3, in some implementations, N type enhancement region 340 adjoins each of first control trench 320a and first, second, and third depletion trenches 322a, 322b, and 322c.

It is emphasized, however, that N type enhancement region 340 is localized in N type drift region 314 so as not to extend between first control trench 320a and second control trench 320b, and so as not to extend between second control trench 320b and third control trench 320c. As a result, and as shown in FIG. 3, N type enhancement region 340 is not present, i.e., is absent, between first and second control trenches 320a and 320b, and between second and third control trenches 320b and 320c.

Bipolar semiconductor device 300 corresponds in general to bipolar semiconductor device 100, in FIG. 1. That is to say, semiconductor substrate 302, P type anode layer 310, N type buffer layer 312, and N type drift region 314, in FIG. 3, correspond respectively in general to semiconductor substrate 102, P type anode layer 110, N type buffer layer 112, and N type drift region 114, in FIG. 1, and may share any of the characteristics attributed to those corresponding features, above.

In addition, P type inversion region 316, P type contacts 334, and N type cathode diffusions 332, in FIG. 3, correspond respectively in general to P type inversion region 116, P type contacts 134, and N type cathode diffusions 132, in FIG. 1 and may share any of the characteristics attributed to those corresponding features, above.

First control trench 320a and second control trench 320b, each including trench insulator 324 and control trench electrode 326, in FIG. 3, correspond respectively in general to first control trench 120a and second control trench 120b, each including trench insulator 124 and control trench electrode 126, in FIG. 1, and may share any of the characteristics attributed to those corresponding features, above. In addition, third control trench 320c including trench insulator 324 and control trench electrode 326, corresponds in general to either of first or second control trenches 120a and 120b including trench insulator 124 and depletion electrode 128, in FIG. 1, and may share any of the characteristics attributed to those corresponding features, above.

Furthermore, first and second depletion trenches 322a and 322b, each including trench insulator 324 and depletion electrode 328, correspond respectively in general to first and second depletion trenches 122a and 122b, each including trench insulator 124 and depletion electrode 128, in FIG. 1, and may share any of the characteristics attributed to those corresponding features, above. Moreover, third depletion trench 322c including trench insulator 324 and depletion electrode 328, corresponds in general to either of first or second depletion trenches 122a and 122b including trench insulator 124 and depletion electrode 128, in FIG. 1, and may share any of the characteristics attributed to those corresponding features, above.

N type enhancement region 340, in FIG. 3, corresponds in general to N type enhancement region 140, in FIG. 1, and may share any of the characteristics attributed to that corresponding feature, above. In other words, N type enhancement region 340 may be a multi-trench enhancement region have a doping concentration of from approximately $1\times10^{15}/cm^3$ to approximately $1\times10^{16}/cm^3$.

It is noted that, like bipolar semiconductor device 100, in FIG. 1, bipolar semiconductor device 300, in FIG. 3, may take the form of an IGBT. In that implementation, P type anode layer 310 corresponds to a P type collector layer, P type inversion region 316 corresponds to a P type base, and N type cathode diffusions 332 correspond to N type emitter diffusions of the IGBT. Moreover, when bipolar semiconductor device 300 is implemented as an IGBT, first, second, and third control trenches 320a, 320b, and 320c correspond respectively to first, second, and third gate trenches of the IGBT, each including a gate insulator and a gate electrode corresponding respectively to trench insulator 324 and control trench electrode 326.

The reduced charge in the upper portion of N type drift region 314 due to the absence of N type enhancement region 340 between first control trench 320a and second control trench 320b, and between second control trench 320b and third control trench 320c allows the depletion region that begins to form when bipolar semiconductor device 300 is turned off to expand more rapidly. In addition, the Miller capacitance of bipolar semiconductor device 300 is reduced due to the overall reduction in charge between top surface 306 and P type anode layer 310. Consequently, $E_{OFF}$ and $T_{d,OFF}$ are substantially improved, i.e., reduced, in the implementation shown in FIG. 3, when compared to conventional bipolar semiconductor devices, such as conventional IGBTs. Moreover, these advantages may be achieved while maintaining the $V_{ON}$ of bipolar semiconductor device 300 at a desirable level.

Additional advantages accrue from the implementation shown in FIG. 3 when the unit cell pitch of bipolar semiconductor device 300 becomes ultra-narrow. During the on-state, such an ultra-narrow geometry would typically result in a high electric field between first depletion trench 322a and first control trench 320a if N type enhancement region 340 did not extend between first control trench 320a and first depletion trench 322a. That high electric field could cause the accumulation of holes along the sidewalls of first depletion trench 322a, which would enhance the extraction of holes during conduction, resulting in poorer conductivity modulation. The presence of N type enhancement region 340 between first control trench 320a and first depletion trench 322a advantageously reduces such an electric field, thereby improving conductivity modulation for a bipolar semiconductor device, such as an IGBT, having an ultra-narrow unit cell pitch.

Thus, the present application discloses implementations of a bipolar semiconductor device with multi-trench enhancement regions. As disclosed in the present application, by localizing or confining enhancement regions so as not to extend between adjacent control trenches, such as gate trenches, the present solution enables a bipolar semiconductor device to have lower $E_{OFF}$ and shorter $T_{d,OFF}$ when compared to conventional devices, such as conventional IGBTs. In addition, these advantages may be achieved while maintaining the $V_{ON}$ of the bipolar semiconductor device at a desirable level. Moreover, by localizing the enhancement regions between depletion trenches and between a depletion trench and an adjacent control trench, the present solution enables improved conductivity modulation by a bipolar semiconductor device having an ultra-narrow unit cell pitch.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A bipolar semiconductor device comprising a plurality of unit cells, each of said plurality of unit cells comprising:
a drift region having a first conductivity type situated over an anode layer having a second conductivity type opposite said first conductivity type;
a first control trench extending through an inversion region having said second conductivity type, and further extending into said drift region, said first control trench adjacent to cathode diffusions;
first and second depletion trenches, each having a depletion electrode;
said first depletion trench being situated between said second depletion trench and said first control trench;
an enhancement region having said first conductivity type localized in said drift region and extending from said first control trench to said first depletion trench and further from said first depletion trench to said second depletion trench; and
a second control trench adjacent to said first control trench, said enhancement region not extending between said first control trench and said second control trench.

2. The bipolar semiconductor device of claim 1, wherein a doping concentration of said enhancement region is greater than a doping concentration of said drift region.

3. The bipolar semiconductor device of claim 1, wherein a doping concentration of said enhancement region is less than a doping concentration of said cathode diffusions.

4. The bipolar semiconductor device of claim 1, wherein said depletion electrodes are electrically coupled to said cathode diffusions.

5. The bipolar semiconductor device of claim 1, wherein each of said plurality of unit cells further comprises a buffer layer having said first conductivity type situated between said anode layer and said drift region.

6. The bipolar semiconductor device of claim 1, wherein said first conductivity is N type and said second conductivity is P type.

7. The bipolar semiconductor device of claim 1, wherein each of said plurality of unit cells further comprises a third depletion trench adjacent to said first and second depletion trenches, said enhancement region further extending from said second depletion trench to said third depletion trench.

8. The bipolar semiconductor device of claim 1, wherein each of said plurality of unit cells further comprises a third control trench adjacent to said second control trench, said enhancement region not extending between said second control trench and said third control trench.

9. The bipolar semiconductor device of claim 8, wherein each of said plurality of unit cells further comprises a third depletion trench adjacent to said first and second depletion trenches, said enhancement region further extending from said second depletion trench to said third depletion trench.

10. An insulated-gate bipolar transistor (IGBT) comprising a plurality of IGBT unit cells, each of said plurality of IGBT unit cells comprising:
a drift region having a first conductivity type situated over a collector having a second conductivity type opposite said first conductivity type;
a first gate trench extending through an inversion region having said second conductivity type, and further extending into said drift region, said first gate trench adjacent to emitter diffusions;

first and second depletion trenches, each having a depletion electrode;

said first depletion trench being situated between said second depletion trench and said first gate trench;

an enhancement region having said first conductivity type localized in said drift region and extending from said first gate trench to said first depletion trench and further from said first depletion trench to said second depletion trench; and a second gate trench adjacent to said first gate trench, said enhancement region not extending between said first gate trench and said second gate trench.

11. The IGBT of claim 10, wherein a doping concentration of said enhancement region is greater than a doping concentration of said drift region.

12. The IGBT of claim 10, wherein a doping concentration of said enhancement region is less than a doping concentration of said emitter diffusions.

13. The IGBT of claim 10, wherein said depletion electrodes are electrically coupled to said emitter diffusions.

14. The IGBT of claim 10, wherein each of said plurality of IGBT unit cells further comprises a buffer layer having said first conductivity type situated between said collector and said drift region.

15. The IGBT of claim 10, wherein said first conductivity is N type and said second conductivity is P type.

16. The IGBT of claim 10, wherein each of said plurality of IGBT unit cells further comprises a third depletion trench adjacent to said first and second depletion trenches, said enhancement region further extending from said second depletion trench to said third depletion trench.

17. The IGBT of claim 10, wherein each of said plurality of IGBT unit cells further comprises a third gate trench adjacent to said second gate trench, said enhancement region not extending between said second gate trench and said third gate trench.

18. The IGBT of claim 17, wherein each of said plurality of IGBT unit cells further comprises a third depletion trench adjacent to said first and second depletion trenches, said enhancement region further extending from said second depletion trench to said third depletion trench.

* * * * *

UNITED STATES PATENT AND TRADEMARK OFFICE
CERTIFICATE OF CORRECTION

PATENT NO. : 10,164,078 B2
APPLICATION NO. : 15/074062
DATED : December 25, 2018
INVENTOR(S) : Udrea et al.

It is certified that error appears in the above-identified patent and that said Letters Patent is hereby corrected as shown below:

On the Title Page

Item (57), Abstract Line 15, please change "the first second depletion" to -- the first depletion --

Signed and Sealed this
Twelfth Day of March, 2019

Andrei Iancu
*Director of the United States Patent and Trademark Office*